United States Patent
Tomimori et al.

(10) Patent No.: US 6,864,187 B2
(45) Date of Patent: Mar. 8, 2005

(54) METHOD OF WASHING A SEMICONDUCTOR WAFER

(75) Inventors: Hiroaki Tomimori, Tokyo (JP); Hidemitsu Aoki, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 149 days.

(21) Appl. No.: 10/192,728

(22) Filed: Jul. 11, 2002

(65) Prior Publication Data

US 2003/0013310 A1 Jan. 16, 2003

(30) Foreign Application Priority Data

Jul. 12, 2001 (JP) ........................................ 2001-212204

(51) Int. Cl.[7] ................... H01L 21/336; H01L 21/8238
(52) U.S. Cl. ................. 438/745; 438/756; 438/197
(58) Field of Search .................. 438/745, 746, 438/704, 706, 714, 715, 691, 743

(56) References Cited

U.S. PATENT DOCUMENTS

| | | | |
|---|---|---|---|
| 5,725,414 A | * | 3/1998 | Moinpour et al. ............. 451/41 |
| 5,904,164 A | * | 5/1999 | Wagner et al. ............... 134/148 |
| 5,916,366 A | * | 6/1999 | Ueyama et al. ............... 118/52 |
| 6,037,201 A | * | 3/2000 | Tsai et al. .................... 438/197 |
| 6,106,369 A | * | 8/2000 | Konishi et al. ............... 451/41 |
| 6,202,658 B1 | | 3/2001 | Fishkin et al. |
| 6,330,728 B2 | * | 12/2001 | Ueki et al. ..................... 15/77 |
| 6,332,835 B1 | * | 12/2001 | Nishimura et al. ........... 451/67 |
| 6,345,630 B2 | | 2/2002 | Fishkin et al. |
| 6,431,185 B1 | * | 8/2002 | Tomita et al. ............... 134/1.3 |
| 6,444,582 B1 | * | 9/2002 | Tsai ........................... 438/691 |
| 6,503,333 B2 | * | 1/2003 | Twu et al. ...................... 134/3 |
| 6,589,878 B1 | * | 7/2003 | Lorimer ...................... 438/704 |
| 6,623,355 B2 | * | 9/2003 | McClain et al. .............. 451/60 |
| 6,673,163 B2 | * | 1/2004 | Tomita et al. ................ 134/34 |

FOREIGN PATENT DOCUMENTS

| | | |
|---|---|---|
| EP | 0 753 884 A2 | 1/1997 |
| TW | 444241 | 7/2001 |
| WO | WO 96/35227 | 11/1996 |

* cited by examiner

Primary Examiner—Michael Lebentritt
(74) Attorney, Agent, or Firm—McGinn & Gibb, PLLC

(57) ABSTRACT

A nozzle which ejects cleaning solution is disposed above the wafer to be cleaned. The position of the nozzle is such that the cleaning solution ejected from the nozzle drops onto a point on the wafer which is 1 cm or more on this side of the center of rotation. An angle which the direction of ejection of the cleaning solution makes with the wafer surface is set preferably at 5° to 45°.

22 Claims, 9 Drawing Sheets

METHOD OF WASHING A SEMICONDUCTOR WAFER

BACKGROUND OF THE INVENTION

1. Field of the Invention

The present invention relates to a method of cleaning a semiconductor wafer in a semiconductor fabricating process. Especially it may be applied in the final rinse step in the semiconductor fabrication process. The present application is based on Japanese Patent application No. 2001-212204 incorporated herein by reference.

2. Description of the Related Art

In the production of semiconductor devices, a cleaning process is included between one production process and the next production process in order to remove particles (dust) and impurities adhering to the wafer surface, which exist in minute amount. Recently, as the size of semiconductor devices are becoming small, particles which are small in size or exist in low concentration are becoming a threat to the production, which raise relative importance of the cleaning technology in turn. Incidentally, the size of particles which would pose a certain problem is 0.1 $\mu$m or more, and today's control on the particle size includes particles of such sizes. If there exist a large amount of particles on a wafer, then they would cause a pattern defect, thereby reducing a manufacturing yield.

FIGS. 13A and 13B are perspective views illustrating a method for cleaning a wafer in a conventional single spin mode. As shown in FIG. 13A, a wafer 1 is held by pins 7 provided on arms 9 of a rotation apparatus 10 and rotated. An axis of rotation of the wafer 1 is perpendicular to the wafer 1 through the center of rotation 3. Since the location of the center of rotation 3 depends on how the wafer is rotated, it does not necessarily coincide with the geometric center of the wafer 1. FIGS. 14A and 14B are plan views of a rotation apparatus 10 comprising pins 7 and arms 9. FIG. 14A illustrates the rotation apparatus 10 before the wafer 1 is placed thereupon, and FIG. 14B illustrates the rotation apparatus 10 with the wafer 1 being held by the pins 7. FIG. 14C is a side view of the wafer 1 which is held by the pins 7, where the wafer 1 rotates as a whole fixture rotates around the rotational axis 8 of the rotation apparatus 10. While the wafer 1 is being rotated, deionized water (not shown in the figures) is ejected from a nozzle 2 onto the center of rotation 3, the nozzle 2 being positioned directly thereabove. Pure water is sometimes referred to as deionized water (DIW) or ultradeionized water. Therefore, it is referred to as deionized water (DIW) hereinafter. The nozzle 2 may be positioned slightly off of directly above the center of rotation 3 of the wafer 1 as illustration in FIG. 13B. In such a case, deionized water is also ejected in the direction of the center of rotation 3 from the nozzle 2. Deionized water which drops onto the center of rotation 3 on the wafer 1 moves to the periphery of the wafer 1 due to the centrifugal force generated by the rotation of the wafer 1. During that time, deionized water cleans the surface of the wafer 1. The reason that deionized water is ejected onto the center of rotation 3 is that, as described above, deionized water which drops onto the wafer 1 moves from the center of rotation 3 to the periphery of the wafer 1 and, as it so happens, the wafer 1 is efficiently cleaned with a small amount of deionized water.

Inventors of the present invention have revealed that the above-described conventional technology causes problems as described below. Specifically, when the wafer 1 is cleaned with deionized water, the destruction of thin dielectric layers, such as gate oxide films, occurs at the central portion of the wafer 1. And, materials which constitute wirings formed on the wafer 1, Cu, for example, become dissolved or oxidized at exposed portions. More detailed description will be made on a plurality of wiring patterns arranged on a wafer and covered with an insulating layer having via holes to expose the surface of the wiring pattern. If these patterns are arranged in a central portion as well as in a peripheral portion of the wafer 1, then the dissolution or oxidation of wiring metals is more likely to occur for those arranged in the central portion of the wafer 1 than for those in the peripheral portion. In particular each of the wiring patterns comprises a wiring part having a large exposed area in many via holes and a lead part having a small exposed area in a few via holes drawn from said wiring part. Incidentally, as the extent of the large exposed area is greater and that of the small exposed area is lesser, the wiring materials are more susceptible to the dissolution or oxidation. Furthermore, particles become concentrated around the central portion of the wafer, causing pattern defects.

SUMMARY OF THE INVENTION

The inventors of the present invention diligently pursued these problems and have revealed the reasons for the destruction of gate oxide films, the dissolution of metal films, and the undue concentration of particles when cleaning a wafer with deionized water in the central portion thereof, as follows. Specifically, deionized water is a highly resistive material with a specific resistance being as high as 18 M$\Omega$·cm. As a result, when cleaning the surface of the wafer with deionized water, friction which exists between deionized water and the wafer produces static electricity therebetween, which results in positively charged deionized water and a negatively charged wafer. Particularly, since the centrifugal force acting on deionized water near the center of rotation of the wafer is weaker than that on the periphery of the wafer, deionized water supplied around the center of rotation of the wafer stays on the surface longer than that supplied to the periphery of the wafer does. As a result, electric charge produced through frictional contact of deionized water and the wafer generates locally around the center of rotation of the wafer. Therefore, the wafer becomes negatively charged more significantly on the central portion than on the peripheral portion.

This may result in the dielectric breakdown in thin gate oxide films on the central portion of the wafer because of the negative charge which has generate in the wafer. Recently, since a thickness of the gate oxide film is 1.5 to 2.0 nm, which is extremely thin, the dielectric breakdown easily occurs with a small amount of static charge. Moreover, in a wiring pattern disposed in the central portion of the wafer, or especially in a small exposed area of a narrow lead part drawn from a wiring part with a large exposed area, wiring metals such as Cu become susceptible to the dissolution or oxidation. Furthermore, since the wafer is negatively charged more significantly on the central portion than the peripheral portion, thereby creating a large potential difference therebetween, particles tend to gather on the central portion of the wafer. Incidentally, even in the case where liquid other than deionized water is used as a cleaning solution, if a specific resistance of the cleaning solution is sufficiently high, that is, the same as or more than that of deionized water, then it is conceivable that a phenomenon similar to those described above may occur.

In order to resolve the situation mentioned above, inventors of the present invention devised a method where a cleaning solution is ejected toward the point off the center of rotation of the wafer so that the cleaning solution is prevented from stagnating over the central portion of the wafer, thereby avoiding the generating of electric charge there.

In the first embodiment of the present invention, a wafer is placed on a revolving apparatus to round on the rotation center of the wafer. During the rotation of the wafer, a cleaning solution is provided on a surface of the wafer toward an ejection point which is a specified distance apart from the rotation center of the wafer. The surface of the wafer can be either the one surface where semiconductor devices are formed or the other surface. The term, specified distance, refers to such a distance that the ejected cleaning solution would be carried to around the rotation center by its own momentum and to the periphery of the wafer by the centrifugal force.

The method according to those aspects of the present invention, a cleaning solution can be prevented from stagnating in large amounts around the center of rotation of the wafer. This controls the generation of static electricity due to the friction between the wafer and the cleaning solution, thereby preventing the destruction of gate oxide films due to static electricity, the concentration of particles, and oxidation and dissolution of metal films formed on the wafer.

BRIEF DESCRIPTION OF THE DRAWINGS

Features of the illustrative, non-limiting embodiments of the present invention will be more apparent from the following description taken in conjunction with the accompanying drawings, in which.

DETAILED DESCRIPTION OF THE PREFERRED EMBODIMENTS

Figure 1A:
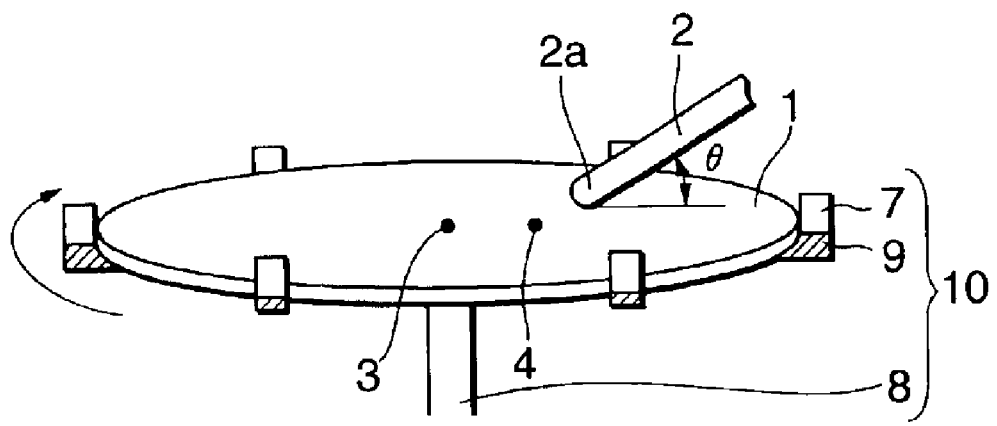
FIG. 1A is a perspective view illustrating a method for cleaning a wafer according to the first embodiment of the present invention and FIG. 1B is a plan view of the wafer of FIG. 1A seen from above.
Figure 14A:
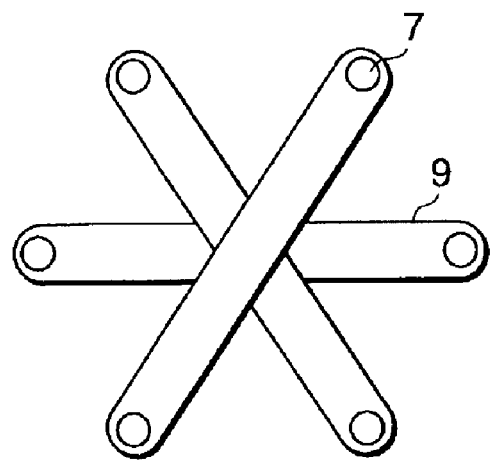
FIG. 14A is a plan view of an apparatus used in a conventional sheet spin mode.
Figure 14B:
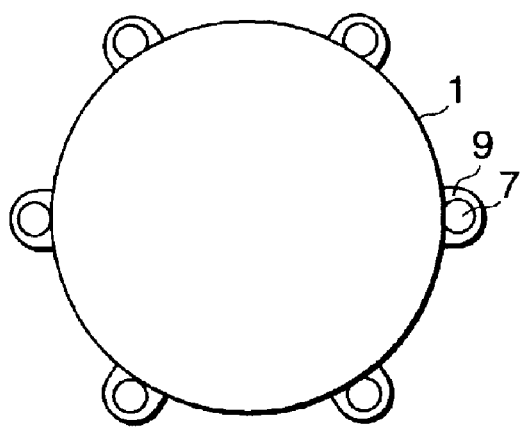
FIGS. 14B and 14C are a plan view and a side view, respectively, of the apparatus with a wafer being placed thereon.
Figure 14C:
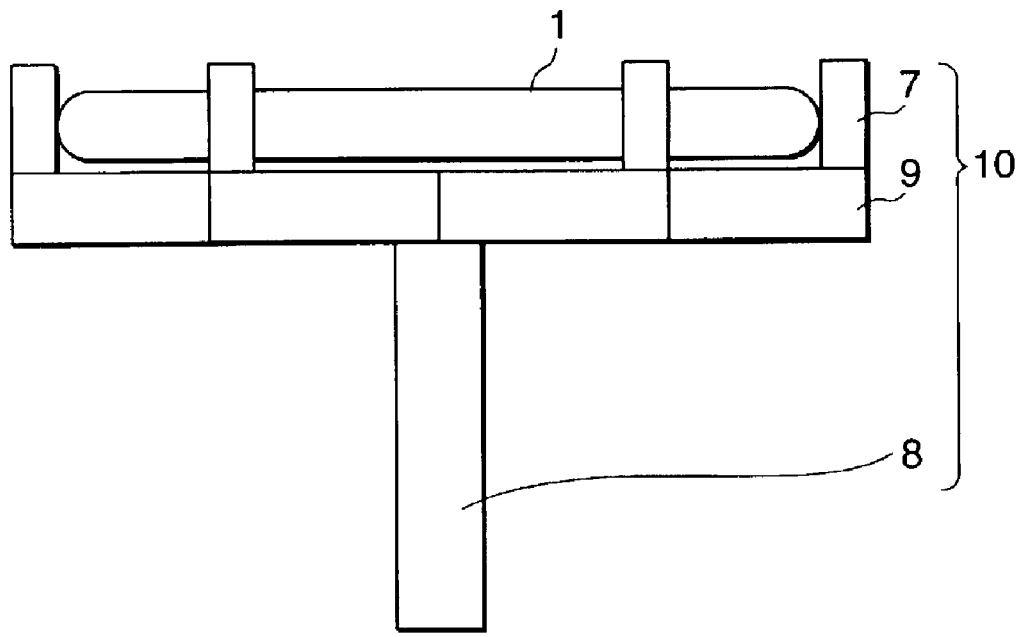

FIG. 1A is a perspective view illustrating a method for cleaning a wafer according to the first embodiment of the present invention. As shown in FIG. 1A, a wafer 1 to be cleaned is held by the pins 7 provided on the arms 9 of the rotation apparatus 10 and rotated. An axis of rotation of the wafer 1 is perpendicular to the wafer 1 through the center of rotation 3. Since the center of rotation 3 of the wafer 1 depends on how the wafer is rotated, the center of rotation 3 does not necessarily coincide with the geometric center of the wafer. The rotation apparatus 10 shown in FIGS. 14A to 14C is used in the first embodiment of the present invention. Rotation of the wafer 1 is accomplished by rotating a whole fixture around the rotational axis 8. While the wafer 1 is being rotated, deionized water (not shown in the figures) is ejected from a nozzle 2 toward the center of rotation 3.

The nozzle 2 which ejects a cleaning solution is disposed above the wafer 1. The nozzle 2 is positioned such that the cleaning solution ejected from the discharge opening 2a of the nozzle 2 drops onto an ejection point 4 on the wafer 1 which is 1 cm or more on the front side of the center of rotation 3. What is meant by saying that the ejection point 4 is on the front side of the center of rotation 3 is that the nozzle 2 is disposed in such a manner that an angle formed by a straight line passing through the center of rotation 3 and the ejection point 4 on the wafer and the vertical projection line of the direction of the nozzle 2 onto the wafer is 0° to 90° when the wafer performs a clockwise rotation on the centre of rotation 3 if the ejection point 4 is defined as the centre of rotation 3 and the straight line is defined as 0°, and is 270° to 360° when the wafer performs a counterclockwise rotation on the centre of rotation 3.

The ejection point 4 is a point which is a certain distance apart from the center of rotation 3 so that it does not stagnate around the center of rotation 3 and, at the same time, that it is carried by its own momentum to and around the center of rotation 3. If the point of ejecting the cleaning solution is too far apart from the center of rotation 3, then the dropped cleaning solution cannot be carried to the center of rotation 3 by its own momentum, and the area near the center of rotation 3 cannot be cleaned. On the other hand, if the point of ejecting the cleaning solution is too close to the center of rotation 3, then the cleaning solution stagnates over the area near the center of rotation 3, thereby causing the generating of static electricity there. Therefore, the cleaning solution is ejected onto a point where it does not stagnate over the center of rotation but can be carried to the center of rotation of the wafer by its own momentum and to the peripheral portion thereof by the centrifugal force.

Furthermore, an angle θ which the direction of the ejection of the cleaning solution makes with the surface of the wafer 1 is set at 5° to 90°.

Incidentally, in the first embodiment, deionized water is used as a cleaning solution.

First, while a wafer 1 is being rotated, deionized water is ejected from an discharge opening 2a of a nozzle 2 in the direction of an ejection point 4 on the wafer 1. The ejection point 4 is 1 cm or more apart from the center of rotation 3. A rotational speed of the wafer 1 is set at 200 to 1,500 rpm, and a flow rate of deionized water from the nozzle 2 is set at 0.5 to 1.5 liter/min. Deionized water which is ejected from the nozzle 2 and drops onto the ejection point 4 on the surface of the wafer 1 is carried by its own momentum to and around the center of rotation 3 of the wafer 1 and further carried to the periphery of the wafer 1 by the centrifugal force due to the rotation, during which time it cleans the surface thereof.

Then, the supply of deionized water is halted, and the surface of wafer 1 is subjected to a spin drying. This spin drying is conducted using a $N_2$ gas or a $CO_2$ gas. For the spin drying of the wafer 1, the chamber where the wafer has been cleaned may be used, where the supply of deionized water is halted while the wafer 1 is being rotated so that a portion of deionized water remaining on the surface of wafer 1 is removed by the centrifugal force due to the rotation of the wafer. Or, the wafer 1 may be transferred to another chamber specially dedicated for drying purposes. According to the former method, a process of transferring the wafer 1 to another chamber can be omitted, thereby accomplishing the drying of the wafer 1 in an efficient manner. According to the latter method, the drying can be performed within an atmosphere where there does not exist any chemical solutions used in those processes proceeding those for cleaning with deionized water, thereby ensuring that such solutions do not adhere to the wafer during drying.

According to a method for cleaning a wafer of the first embodiment, since deionized water drops onto the ejection point 4 which is 1 cm or more apart from the center of rotation 3 of the wafer 1, stagnation of deionized water around the center of rotation 3 as well as the generation of static electricity due to the friction between the stagnated deionized water and the wafer 1 can be prevented. In other words, since deionized water which drops onto the ejection point 4 does not stagnate on a certain area but moves on the wafer 1, thereby cleaning the surface thereof, electric charge does not generate on any location on the wafer 1. As a result, the destruction of gate oxide films which are formed on a central portion of the wafer 1 can be prevented, and so are the oxidation and dissolution of Cu which constitutes wiring and electrodes formed on the surface of wafer 1 and the concentration of particles over the central portion of the wafer 1.

Furthermore, if the direction of the ejection of deionized water is set as previously mentioned, deionized water goes around the center of rotation 3 after it drops onto the ejection point 4, spreading itself all over the surface of wafer 1. This results in the cleaning of whole surface of the wafer 1.

Incidentally, although deionized water is used as a cleaning solution in the first embodiment, choices of the cleaning solution used in the present invention are not limited to deionized water, and aqueous or non-aqueous solutions can be used. For example, water which contains $CO_2$ can be used as a cleaning solution. This reduces the specific resistance of the liquid down to 1 MΩ·cm or less, thereby ensuring that the generating of electric charge on the wafer 1 due to the friction between the wafer 1 and the cleaning solution is duly prevented. By using deionized water or water containing $CO_2$ as a cleaning solution, the occurrence of a residue of cleaning solution which could influence following processes can be prevented. This makes it possible to conduct the cleaning method of the first embodiment as the final rinsing process.

Reasons for the numerical limitations in the constituent elements of the present invention will be described as follows.

Distance on the Wafer Surface Between the Ejection Point of the Cleaning Solution and the Center of Rotation: 1 cm or More In the first embodiment of the present invention, a cleaning solution is not ejected directly onto the center of rotation of the wafer. This prevents the cleaning solution from stagnating and, consequently, static electricity from charging up around the center of rotation of the wafer where the centrifugal force is weak. If a distance on the wafer surface between the ejection point and the center of rotation is less than 1 cm, then the above-mentioned effect cannot be obtained. Hence, a distance on the wafer surface between the ejection point of the cleaning solution and the center of rotation is set at 1 cm or more.

Angle Which an Ejection Flow of Cleaning Solution Makes with the Wafer Surface: 5° to 90°

Figure 1B:
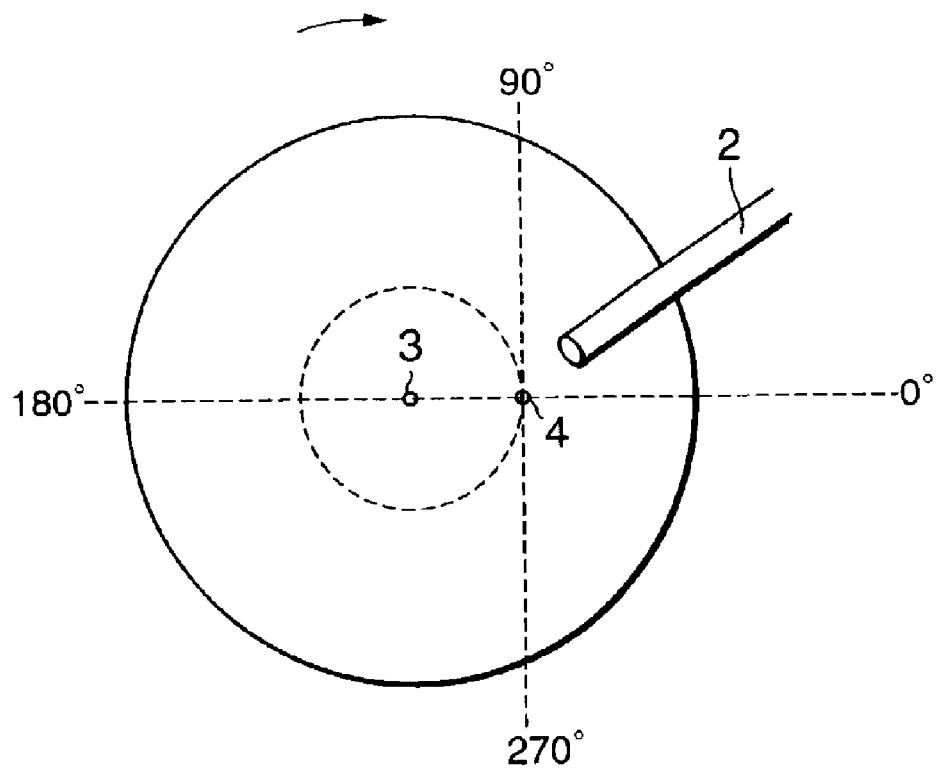

As shown in FIG. 1B, when an angle which an ejection flow of cleaning solution makes with the wafer surface is larger than 90°, the nozzle 2 should be disposed in such a manner that angle formed by a straight line passing through the center of rotation 3 and the ejection point 4 on the wafer and the vertical projection of the direction of the nozzle 2 onto the wafer is larger than 90°. Therefore, angle which an ejection flow of cleaning solution makes with the wafer surface is 90° or below. On the other hand, if the angle is less than 5°, then the cleaning solution sometimes does not reach the center of rotation of the wafer. Therefore, this angle is preferably set at 5° to 70°, or more preferably 5° to 45°, although the angle is not limited to these values.

Specific Resistance of the Cleaning Solution: 1 MΩ·cm or less

If the specific resistance of the cleaning solution is 1 MΩ·cm or less, then the conductivity of the cleaning solution increases. This ensures that the wafer is prevented from becoming negatively charged due to the friction between the wafer and the cleaning solution, thereby ensuring that the destruction of gate oxide films, the concentration of particles, and the dissolution and oxidation of oxide films are duly prevented. Therefore, it is preferable that the specific resistance of cleaning solution be 1 MΩ·cm or less. Such a cleaning solution having specific resistance of 1 MΩ·cm or less can be obtained, for example, by having $CO_2$ contained in deionized water.

Number of Revolutions of the Wafer Per Minute: 20 to 4,000 rpm

If the number of revolutions of the wafer per minute is less than 20 rpm, then the current of cleaning solution on the wafer becomes slow, lowering the cleaning efficiency. Particularly, when the number of revolutions of the wafer per minute is 5 rpm or less, then even if the cleaning solution is dropped on the wafer at a point 1 cm or more apart from the center of revolution, a localized generating of electric charge occurs at said drop point. On the other hand, if the number of revolutions of the wafer exceeds 4,000 rpm, the centrifugal force acting on the cleaning solution becomes too strong, which increases the friction between the cleaning solution and the wafer and facilitates the generating of electric charge on the wafer. When the revolutions of the wafer is too fast, if, for example, the thickness of the gate oxide film formed on the wafer surface is 100 nm, then the amount of electric charge may reach −50 V. In such a case, the gate oxide film becomes subjected to an electric field of 5 MV/cm, which may destroy the gate oxide film. Therefore, the number of revolutions of the wafer per minute is preferably 20 to 4,000 rpm, or more preferably 200 to 1,500 rpm.

Flow Rate of the Cleaning Solution: 0.5 to 5 liters/min

The less the flow rate of the cleaning solution is, the less the amount of generating of electric charge on the wafer becomes. Therefore, in order to decrease the amount of generating of electric charge, it is preferable that the flow rate of the cleaning solution is low. However, if the flow rate of the cleaning solution is less than 0.2 liter/min, then the cleaning efficiency decreases. On the other hand, in order to maintain the cleaning efficiency at a satisfactory level, it is preferable that the flow rate be 2 liters/min or more although the rate of increase of the amount of generating of charge on the wafer saturates at the flow rate of 2 liters/min or more. If the flow rate of the cleaning solution exceeds 5 liters/minute, then the increase of cleaning efficiency saturates with respect to the amount of cleaning solution. Therefore, the flow rate of the cleaning solution is preferably 0.2 to 5 liters/min, or more preferably 0.5 to 1.5 liters/min. In particular, when the diameter of the wafer is 8 inches, it is preferable that the lower limit of the flow rate of the cleaning solution be 0.5 liter/min.

Figure 2A:
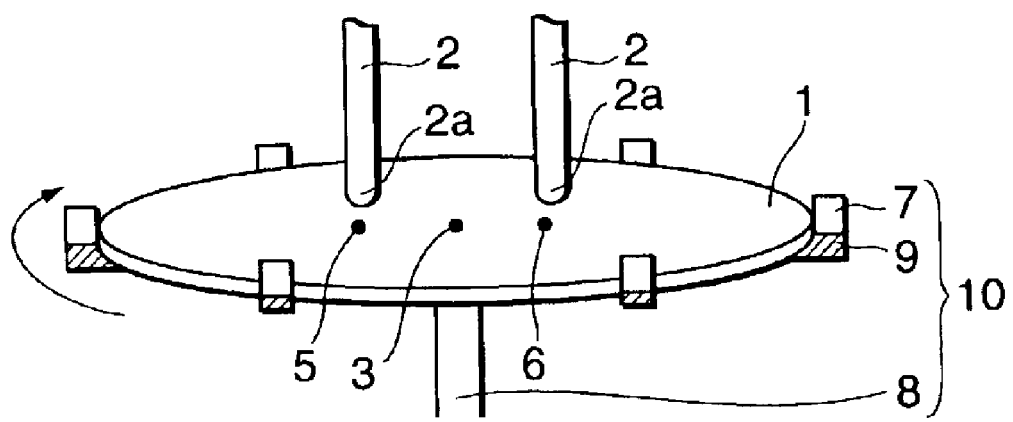
FIG. 2A is a perspective view illustrating a method for cleaning a wafer according to the second embodiment of the present invention.
Figure 2B:
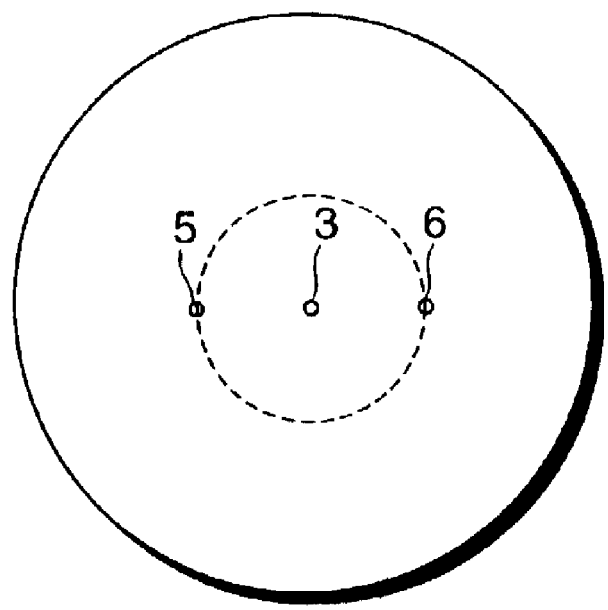
FIG. 2B is a plan view of the wafer of FIG. 2A seen from above.

Next, the second embodiment of the present invention will be described. FIG. 2A is a perspective view illustrating a method for cleaning a wafer according to the second embodiment. A couple of nozzles 2 which eject a cleaning solution are provided above the wafer 1. Positions of the nozzles 2 are determined in such a manner that the cleaning solution ejected from discharge openings 2a of the nozzles 2 drops onto positions 5 and 6, respectively, which are 1 cm or more apart from the center of rotation 3 and goes around over the center of rotation 3 after it drops onto the wafer. In the second embodiment, the nozzles 2 are provided such that an angle which an ejection flow of cleaning solution makes with the wafer surface is about 90° and the discharge openings 2a are located at the lower ends of the nozzles 2. Details of the method for cleaning a wafer in the second embodiment are the same as those previously described in the first embodiment except for the number of the nozzles 2.

In the second embodiment, in addition to the effects previously described, the cleaning solution can be scattered to a wider area of the wafer 1 through the two nozzles 2. This ensures that the stagnation of cleaning solution over a certain part of the wafer is duly prevented and that the wafer 1 can be cleaned in an efficient manner with less amount of cleaning solution.

In the first and second embodiments, the shape of the discharge opening 2a of nozzle 2 may be configured such that the cleaning solution is ejected in a showery pattern. In such a case, if the ejection of cleaning solution is arranged such that the center of the ejection pattern made by an ejected flow from the discharge opening 2a comes to a point 1 cm or more apart from the center of rotation 3 of wafer 1, then a portion of the ejected flow may be allowed to be incident upon the center of rotation 3. Moreover, it is preferable that an angle which the direction of the ejection center makes with the surface of wafer 1 be 5° to 90°, or more preferably 5° to 45°. As described here, by ejecting a cleaning solution onto the wafer in a showery pattern, the cleaning solution can be scattered more effectively, and the cleaning solution can be certainly prevented from locally stagnating on the wafer.

Figure 3:
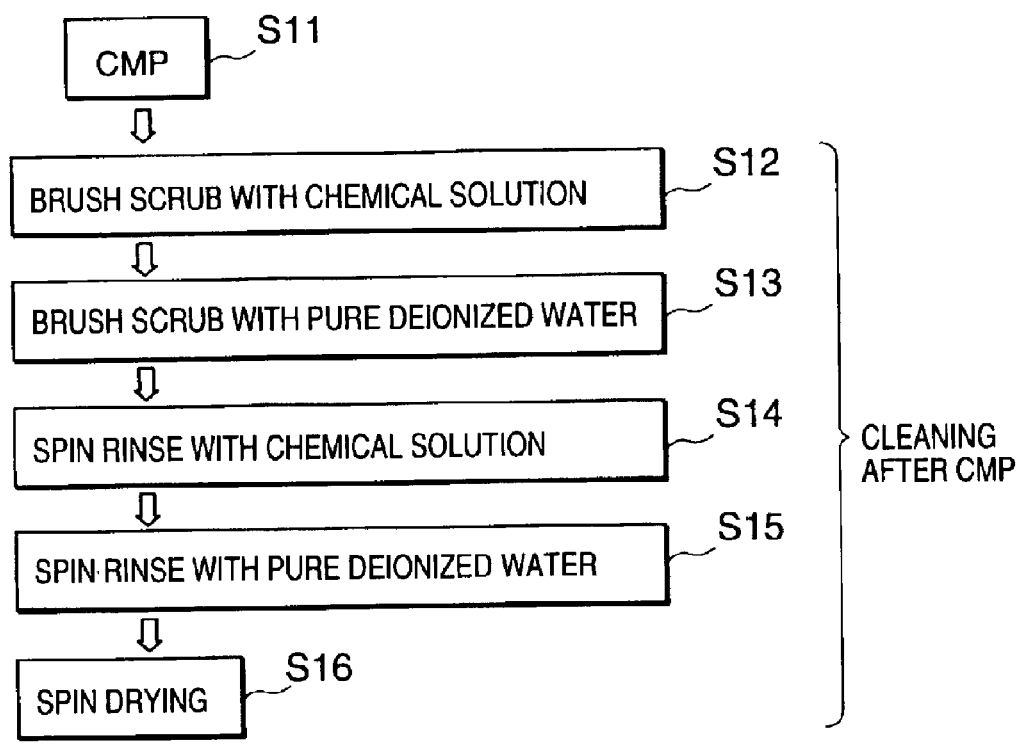
FIG. 3 is a flow chart illustrating cleaning processes in the third embodiment of the present invention.

Next, the third embodiment of the present invention will be described. FIG. 3 is a flow chart illustrating processes in the third embodiment. As shown in FIG. 3, the third embodiment is an example of adopting the method for cleaning a wafer according to the present invention to cleaning processes after the Chemical Mechanical Polishing (CMP). First, as shown in step S11 in FIG. 3, CMP is conducted to smoothen the wafer surface, and then a brush scrub with chemical solution is conducted on the wafer surface as shown in step S12. Next, as shown in step S13, a brush scrub with deionized water is conducted. Next, as shown in step S14, a spin rinse with chemical solution is conducted where the chemical solution is ejected onto the center of the wafer surface while the wafer is being rotated. Next, as shown in step S15, a spin rinse with deionized water is conducted to remove the chemical solution used in step S14. Then, as shown in step S16, the wafer is subjected to a spin drying. Details of steps S15 and S16 are the same as the steps of cleaning and drying processes for a wafer in the first embodiment previously described. Accordingly, the destruction of gate oxide films due to static electricity, the concentration of particles, and the dissolution of Cu can be prevented during cleaning processes after CMP.

Figure 4:
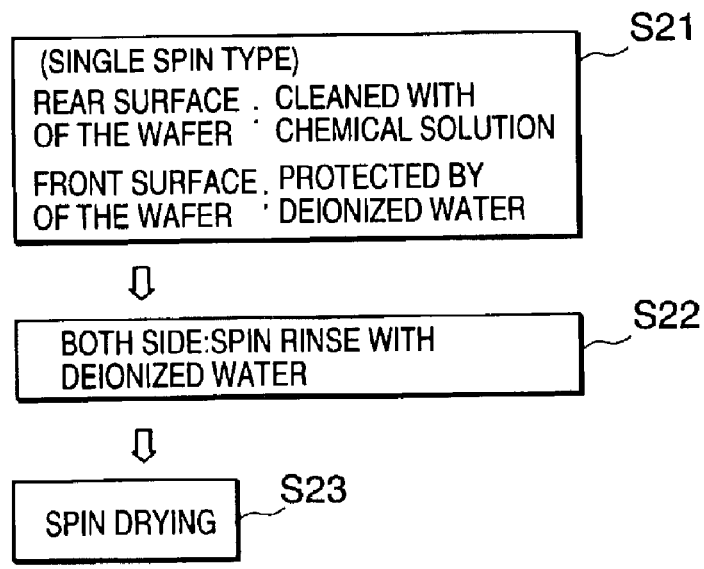
FIG. 4 is a flow chart illustrating processes in the fourth embodiment of the present invention.

Next, the fourth embodiment of the present invention will be described. FIG. 4 is a flow chart illustrating processes in the fourth embodiment. As shown in FIG. 4, the fourth embodiment is an example of adopting the method for cleaning a wafer according to the present invention to cleaning of the rear surface of a wafer. First, as shown in step S21, the rear surface of the wafer is cleaned with chemical solution ejected thereonto while the wafer is being rotated. Usually, this cleaning of the rear surface of the wafer is conducted in order to remove contaminants of metals and particles. When this is being done, deionized water is ejected onto the wafer to protect the surface thereof. This protection for the wafer is provided to prevent the aforementioned chemical solution from being splashed back onto the wafer surface and adhering thereto as well as to protect an atmosphere close to the wafer surface. Next, as shown in step S22, a spin rinse is conducted on the front and rear surfaces of the wafer with deionized water ejected thereonto, thereby removing the above-mentioned chemical solution from the rear surface. Then, as shown in step S23, the wafer is subjected to a spin drying. Details of the methods for protecting the surface in step S21, rinsing the front and rear surfaces in step S22 and spin-drying in step S23 are the same as the steps of the method for cleaning and drying of the wafer illustrated in the first embodiment. According to the fourth embodiment, when cleaning the rear surface of the wafer with a chemical solution, the rear surface can be prevented from being contaminated with this chemical solution. Furthermore, during the processes rinsing the both sides of the wafer after the cleaning of the rear surface and protecting wafer surface with deionized water, the destruction of gate oxide films due to the static electricity, the concentration of particles and the dissolution of Cu can all be controlled.

Figure 5:
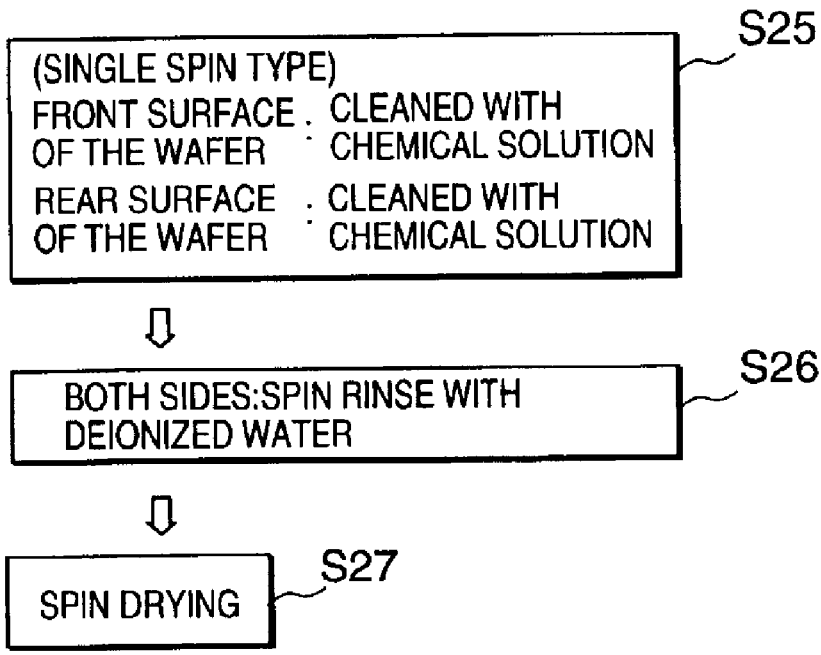
FIG. 5 is a flow chart illustrating processes in the fifth embodiment of the present invention.

Next, the fifth embodiment of the present invention will be described. FIG. 5 is a flow chart illustrating processes in the fifth embodiment. As shown in FIG. 5, the fifth embodiment is an example of adopting the method for cleaning a wafer according to the present invention to a front-back cleaning. First, as shown in step S25, both front and rear surfaces of the wafer is cleaned with chemical solution ejected thereonto while the wafer is being rotated. Usually, this cleaning of the front and rear surfaces of the wafer is conducted in order to remove contaminants of metals and particles. Next, as shown in step S26, a spin rinse is conducted on the front and rear surfaces of the wafer with deionized water ejected thereonto, thereby removing the above-mentioned chemical solution from the front and rear surfaces. Then, as shown in step S27, the wafer is subjected to a spin drying. Details of the methods for rinsing the front and rear surfaces in step S26 and for spin-drying in step S27 are the same as the steps of the method for cleaning a wafer illustrated in the first embodiment previously described. According to the fifth embodiment, during rinsing after cleaning the front and rear surfaces of the wafer, the destruction of gate oxide films due to static electricity, the concentration of particles and the dissolution of Cu can be controlled.

Figure 6:
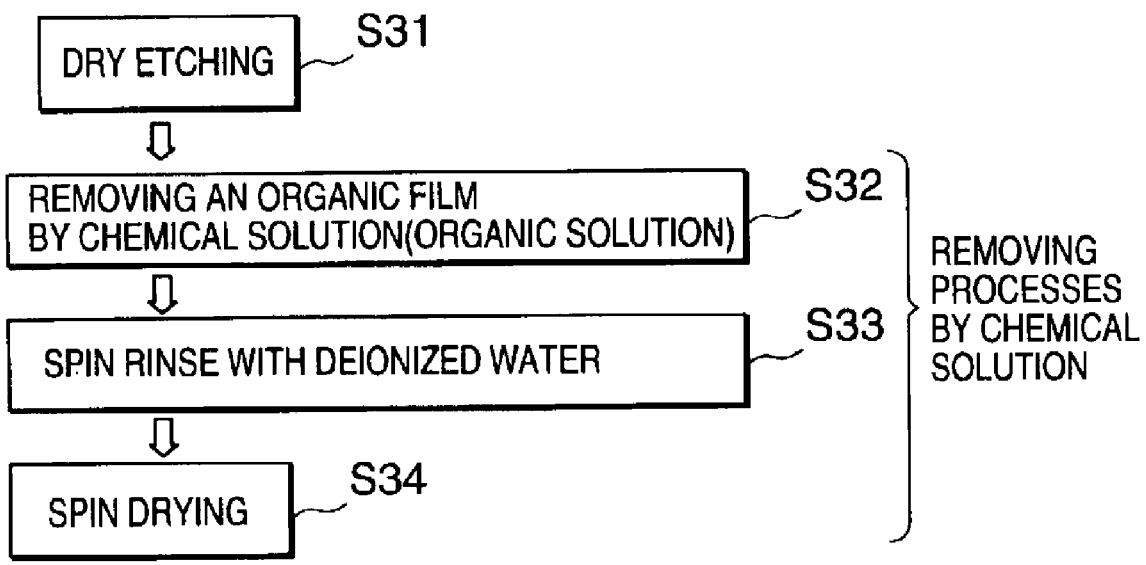
FIG. 6 is a flow chart illustrating processes in the sixth embodiment of the present invention.

Next, the sixth embodiment of the present invention will be described. FIG. 6 is a flow chart illustrating processes in the sixth embodiment. As shown in FIG. 6, the sixth embodiment is an example of adopting the method for cleaning a wafer according to the present invention to cleaning processes after the organic film remove process where an organic film is removed from the wafer surface. Incidentally, the term, organic film, refers to a resist, an antireflection coating, etc. First, as shown in step S31 in FIG. 6, a wafer which has an organic film such as a resist formed thereon is subjected to a dry etching. Then, as shown in step S32, the organic film on the wafer surface is removed by using organic chemical solution. When this is being done, if the organic chemical solution is an amine-based organic removal solution, then it is likely that an removal tool of batch-spraying type is used. If the organic chemical solution is a fluorine-based organic removal solution, then it is likely that an removal tool of singl spin type is used. Currently, the latter is used more often. After the step S32, a residue of the organic film is still on the wafer surface. Next, as shown in step S33, the wafer is subjected to a spin rinsing with deionized water ejected thereonto while the wafer is being rotated, thereby removing the organic chemical solution and the residue of the organic film previously described. Next, as shown in step S34, the wafer is subjected to a spin drying. Details of the methods for rinsing in step S33 and for spin drying in step S34 are the same as the steps of the first embodiment previously described. According to the sixth embodiment, during the rinsing processes on the wafer surface after the removal by chemical solution, the destruction of gate oxide films, the concentration of particles and the dissolution of Cu can be prevented.

Figure 7:
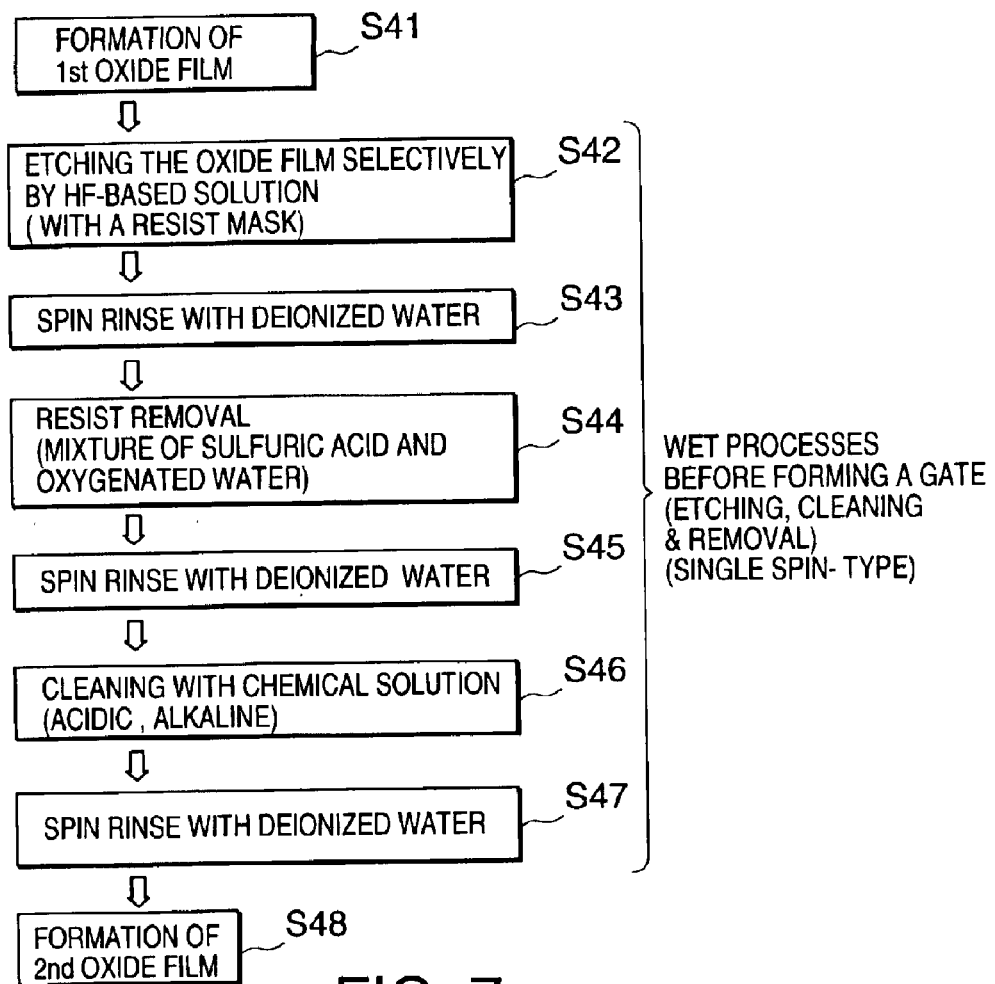
FIG. 7 is a flow chart illustrating processes in the seventh embodiment of the present invention.

Next, the seventh embodiment of the present invention will be described. FIG. 7 is a flow chart illustrating processes in the seventh embodiment. As shown in FIG. 7, the present embodiment is an example of adopting the method for cleaning a wafer according to the present invention to cleaning steps in the wet processes when forming a gate oxide film of multioxide on the wafer surface. First, as shown in step S41, a first oxide film of a thickness of, for example 3.0 mm, is formed on the surface of the wafer. Next, as shown in step S42, a resist is formed on this first oxide film, and by using this resist, the first oxide film is etched with a HF-based solution, thereby selectively removing the first oxide film. Next, as shown in step S43, the wafer is rinsed with deionized water, thereby removing the HF-based solution. This rinsing process includes spin drying and is conducted using the same method as the spin rinsing and the spin drying processes illustrated in the first embodiment.

Then as shown in step S44, the resist is removed by using a mixture of sulfuric acid and oxygenated water. Next, as shown in step S45, the wafer is rinsed with deionized water, thereby removing the mixture of sulfuric acid and oxygenated water. This rinsing process includes spin drying and is conducted using the same method as the spin rinsing and the spin drying processes illustrated in the first embodiment. Next, as shown in step S46, the wafer is cleaned with chemical solution which is either acidic or alkaline. Next, as shown in step S47, the wafer is rinsed with deionized water, thereby removing the chemical solution. This rinsing process includes spin drying and is conducted using the same method as the spin rinsing and the spin drying processes illustrated in the first embodiment previously described. Then, as shown in step S48, a second oxide film of a thickness of, for example 2.0 nm, is formed. Since the first oxide film blocks the diffusion of oxygen over the wafer, portions of wafer surface where the first oxide film remains are hardly oxidized in step S48. Accordingly, formation of gate oxide films of multioxide can be obtained where gate oxide films of 3.0 nm in thickness are formed on some parts of the wafer surface and those of 2.0 nm on other parts. According to the seventh embodiment, in the rinsing process during the formation of gate oxide films of multioxide on the wafer surface, the concentration of particles due to static electricity can be controlled.

Figure 8:
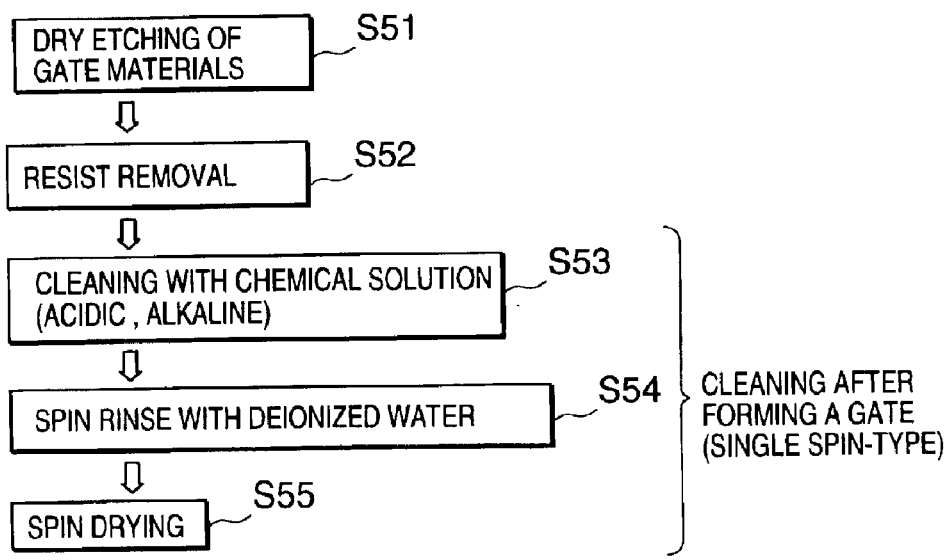
FIG. 8 is a flow chart illustrating processes in the eighth embodiment of the present invention.

Next, the eighth embodiment of the present invention will be described. FIG. 8 is a flow chart illustrating processes in the eighth embodiment. As shown in FIG. 8, the eighth embodiment is an example of adopting the method for cleaning a wafer according to the present invention to cleaning processes after forming gate electrodes on the wafer. First, as shown in step S51, a resist having a specific pattern is formed on a wafer, and using this resist as a mask, the wafer is subjected to a dry etching to obtain gate electrodes. Next, as shown in step S52, the resist is removed. Next, as shown in step S53, the surface of the wafer is cleaned with chemical solution which is either acidic or alkaline using a single type cleaning apparatus. Next, as shown in step S54, the wafer is subjected to a spin rinsing with deionized water ejected thereonto, thereby removing the chemical solution. Next, as shown in step S55, the wafer is subjected to a spin drying. The methods for spin rinsing in step S54 and for spin drying in step S55 are conducted in the same manner as in the first embodiment previously described. According to the eighth embodiment, during rinsing processes after forming gate electrodes, the concentration of particles and the dissolution of Cu can be controlled.

Figure 9:
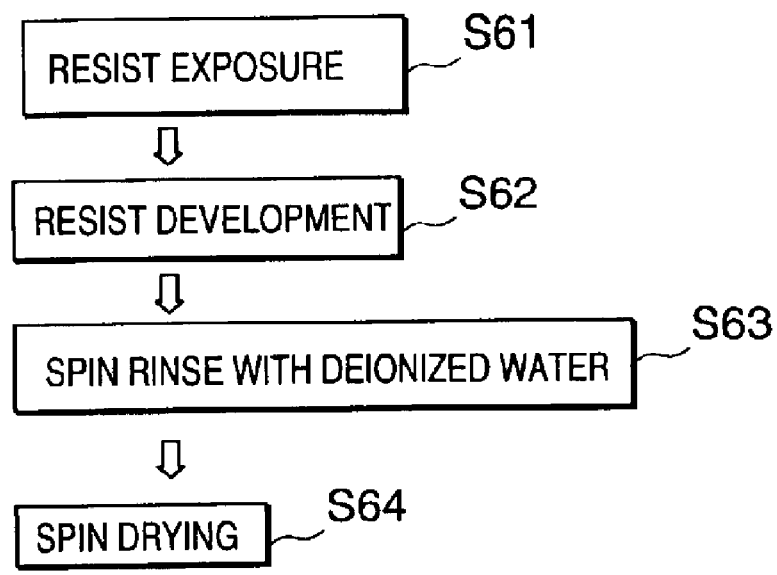
FIG. 9 is a flow chart illustrating processes in the ninth embodiment of the present invention.

Next, the ninth embodiment of the present invention will be described. FIG. 9 is a flow chart illustrating processes in the ninth embodiment. As shown in FIG. 9, the ninth embodiment is an example of adopting the method for cleaning a wafer according to the present invention to cleaning processes after developing a resist. First, as shown in step S61, a resist having a specific pattern is formed on a wafer, which is then exposed to light. Next, as shown in step S62, the resist is developed in a specified developer, thereby forming a specified pattern. Next, as shown in step S63, the wafer is subjected to a spin rinsing with deionized water ejected thereonto, thereby removing the developer. Next, as shown in step S64, the wafer is subjected to a spin drying. Details of the methods for spin rinsing in step S63 and for spin drying in step S64 are the same as those illustrated in the first embodiment previously described. According to the ninth embodiment, during rinsing processes after developing the resist, the concentration of particles and the dissolution of Cu can be controlled.

Incidentally, although, in the second to the ninth embodiment described above, examples are illustrated where deionized water is used as a cleaning solution, its choice in the present invention is not limited to deionized water but may be, for example, water containing $CO_2$ or non-aqueous liquid. However, in the case where a cleaning is conducted in the rinsing processes for the wafer, it is preferable to choose the type of cleaning solution such that no residue remains on the wafer surface after drying it. Furthermore, although, in the third to the ninth embodiments, the spin rinsing is conducted in the same method as in the first embodiment, it may be conducted in the same manner as in the second embodiment where two nozzles are used. Moreover, three or more nozzles may be used, and the cleaning solution may be ejected in a showery pattern.

Hereinafter, effects of the methods for cleaning a wafer according to the present invention will be described. In doing so, the effects will be compared to those obtained in methods which are outside of the scope of the appended claims.

TEST EXAMPLE 1

In test example 1, effects of the ejection point of the cleaning solution upon the generating of electric charge were investigated. First, two wafers of a 200 mm in diameter both having a thermal oxidation film of about 100 nm thickness formed on the surface thereof were prepared. Next, these wafers were subjected to a spin rinsing with deionized water. In doing so, the ejection point of deionized water on the wafer surface was set at 1 cm or more apart from the center of rotation for one of the wafers. For the other wafer, the cleaning solution was ejected right onto the center of rotation. Then, these wafers were subjected to a spin drying. During the processes of spin rinsing and spin drying for these two wafers, conditions other than the ejection point of deionized water were set the same as those in the first embodiment previously described.

Figure 10A:
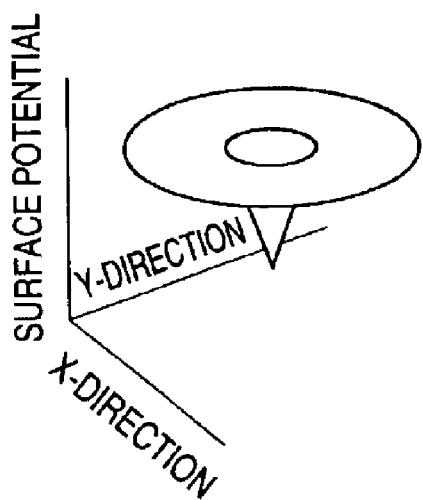
FIG. 10A is a graph illustrating the distribution of surface potential on the wafer after cleaning in a case that the wafer had deionized water ejected right onto the center of rotation, where the X and Y axes represent X and Y directions, respectively, assumed on the wafer surface and the Z axis represents the surface potential.
Figure 10B:
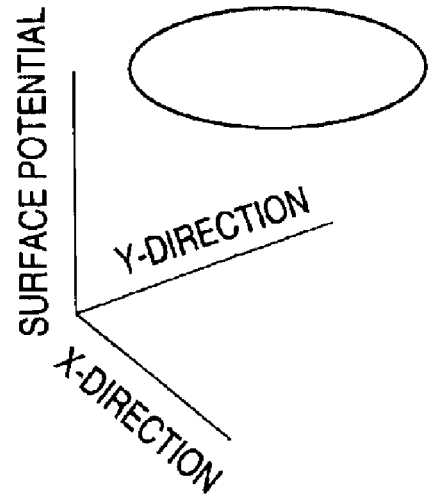
FIG. 10B is a graph illustrating the distribution of surface potential on the wafer after cleaning in a case that the wafer had deionized water ejected onto the point 1 cm or more apart from the center of rotation, where the X and Y axes represent X and Y directions, respectively, assumed on the wafer surface and the Z axis represents the surface potential.

Next, surface potentials of the wafers after a spin drying were measured. Both of FIGS. 10A and 10B are graphs illustrating the distribution of surface potential on the wafer after cleaning, where the X and Y axes represent X and Y directions, respectively, assumed on the wafer surface and the Z axis represents the surface potential. Specifically, FIG. 10A is for the wafer which had deionized water ejected right onto the center of rotation, and FIG. 10B is for the wafer which had deionized water ejected onto the point 1 cm or more apart from the center of rotation. As shown in FIG. 10A, in the case where deionized water was ejected onto the center of rotation of the wafer when conducting a spin rinsing, there appeared a region where the surface potential was low around the center of rotation of the wafer. On the other hand, as shown in FIG. 10B, in the case where deionized water was ejected onto a point 1 cm or more apart from the center of rotation of the wafer during a spin cleaning, the distribution of surface potential on the wafer became uniform.

TEST EXAMPLE 2

In test example 2, effects of the number of revolutions of the wafer per minute upon the generating of electric charge were investigated. First, three wafers of a 200 mm in diameter having a thermal oxidation film of about a 100 nm thickness on the surface thereof were prepared. Next, these wafers were subjected to a spin cleaning with DIW. In doing so, one of the wafers was kept stationary, another one was rotated at 5 rpm, and the last one at 200 rpm. Then, these wafers were subjected to a spin drying. During the processes of spin rinsing and spin drying of these three wafers, conditions other than the rpm of the wafers were kept the same as those of the first embodiment previously described.

Figure 11A:
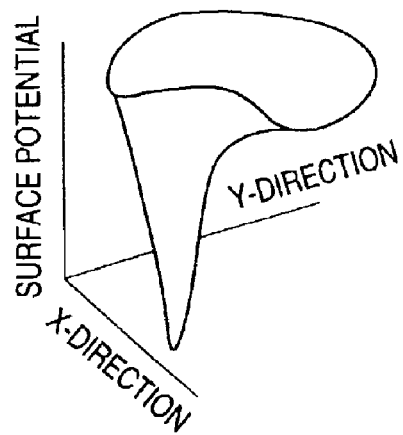
FIG. 11A is a graphs illustrating the distribution of surface potential on the wafer after cleaning in a case that the wafer was kept stationary during cleaning, where the X and Y axes represent X and Y directions, respectively, assumed on the wafer surface and the Z axis represents the surface potential.
Figure 11B:
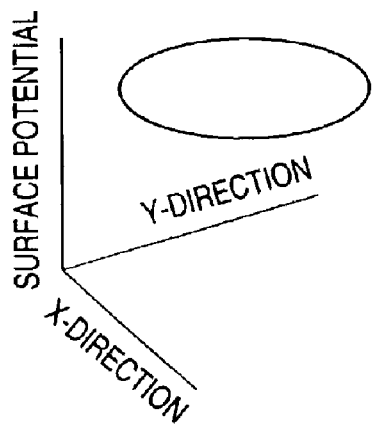
FIG. 11B is a graphs illustrating the distribution of surface potential on the wafer after cleaning in a case that the wafer was rotated at 5 rpm, where the X and Y axes represent X and Y directions, respectively, assumed on the wafer surface and the Z axis represents the surface potential.
Figure 11C:
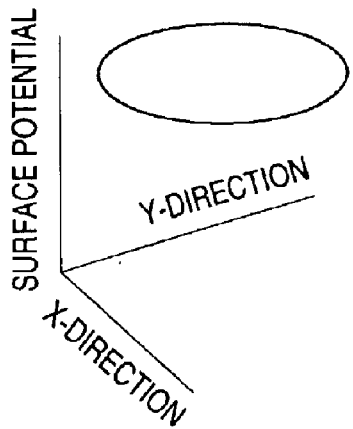
FIG. 11C is a graphs illustrating the distribution of surface potential on the wafer after cleaning in a case that the wafer was rotated at 200 rpm, where the X and Y axes represent X and Y directions, respectively, assumed on the wafer surface and the Z axis represents the surface potential.

Next, surface potentials on the wafers after the spin drying were measured. FIGS. 11A, 11B and 11C are all graphs illustrating the distribution of surface potential on the wafer after cleaning, where the X and Y axes represent X and Y directions, respectively, assumed on the wafer surface and the Z axis represents the surface potential. Specifically, FIG. 11A is for the wafer which was kept stationary, FIG. 11B for the wafer which was rotated at 5 rpm, and FIG. 11C for the wafer which was rotated at 200 rpm. As shown in FIG. 11A, in the case where the wafer was kept stationary during cleaning, there appeared locally a region of low potential at where deionized water was dropped on the wafer. On the other hand, as shown in FIGS. 11B and 11C, in the case where the wafers were rotated at 5 rpm or 200 rpm during the spin rinsing, the distribution of surface potential on the wafer was generally uniform. However, when the wafer was rotated at 5 rpm, the cleaning efficiency was low.

TEST EXAMPLE 3

In test example 3, effects of flow rates of the cleaning solution upon the generating of electric charge were investigated. First, four wafers of a 200 mm in diameter having a thermal oxidation film of about a 100 nm thickness on the surface thereof were prepared. Next, these wafers were subjected to a spin rinsing with DIW. In doing so, flow rates of DIW were varied for each wafer. Then, these wafer were subjected to a spin drying. During processes of spin rinsing and spin drying of these four wafers, conditions other than the flow rate were set the same as those in the first embodiment previously described.

Figure 12:
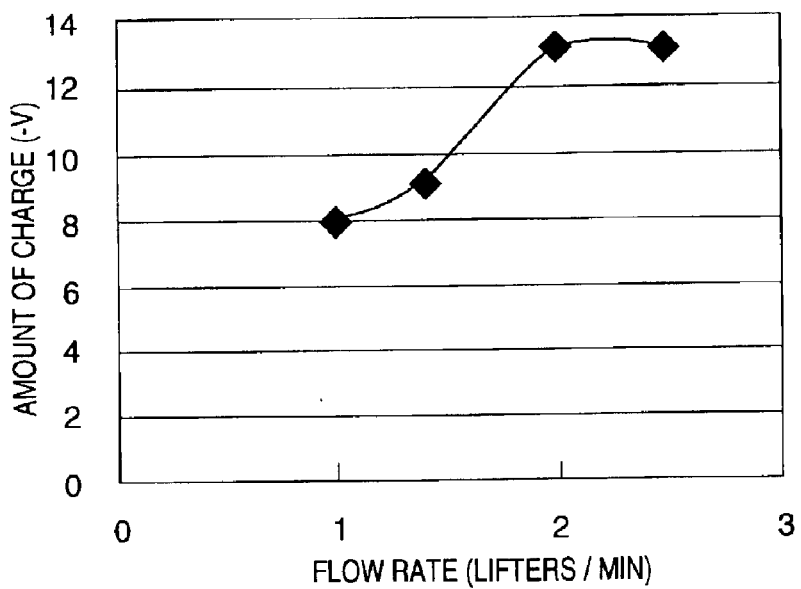
FIG. 12 is a graph illustrating the dependence of the amount of electric charge on the flow rate of DIW, where the horizontal axis represents the flow rate of DIW as cleaning solution, and the vertical axis represents the amount of electric charge generated on the wafer.
Figure 13A:
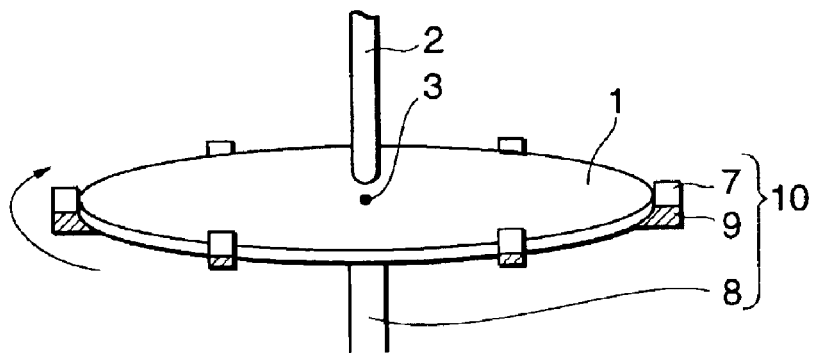
FIGS. 13A and 13B are perspective views illustrating a method for cleaning a wafer in a conventional single spin mode.
Figure 13B:
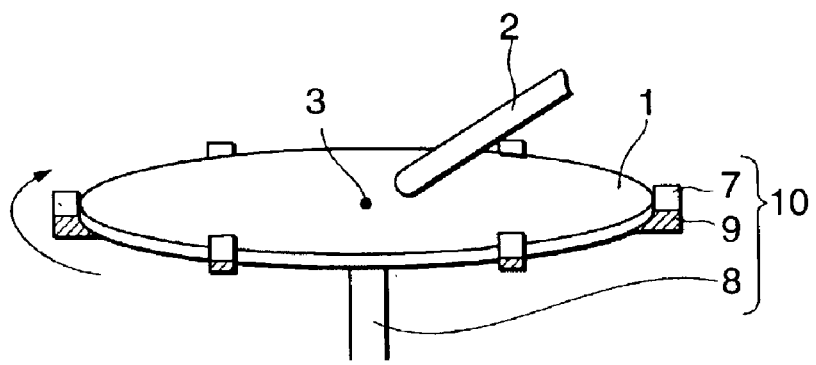

FIG. 12 is a graph illustrating the dependence of the amount of electric charge on the DIW flow rate, where the horizontal axis represents the flow rate of DIW as cleaning solution, and the vertical axis represents the amount of electric charge generated on the wafer, that is, the minimum potential within the wafer. As shown in FIG. 12, the amount of electric charge on the wafer increased as the flow rate of DIW increased. However, the increase in the amount of electric charge reached its saturation point at the flow rate of DIW of 2 liters/min.

As described above, according to the first to the ninth embodiments of the present invention, during spin rinsing processes for the wafer, the generating of electric charge on the wafer can be controlled, and the destruction of gate oxide films and the concentration of particles over the central portion of the wafer can be prevented. Furthermore, the dissolution or oxidation of metal films constituting wiring, electrodes, etc. formed on the wafer can be prevented.

As many apparently widely different embodiments of this invention may be made without departing from the spirit and scope thereof, it is to be understood that the invention is not limited to the specific embodiments thereof except as defined in the appended claims.

It is noted that Applicants intent in the present specification and claims is to encompass equivalents of all claim elements, even if amended during prosecution.

What is claimed is:

1. A method of cleaning a semiconductor wafer which is placed on a rotating apparatus to rotate on a rotation center of said semiconductor wafer, comprising:

rotating said semiconductor wafer;

providing a cleaning solution on one surface of said semiconductor wafer at an ejection point, said ejection point being separate from said rotation center at such a distance that prevents said cleaning solution from forming more at around said rotation center than at a periphery area of said semiconductor wafer, and that allows said cleaning solution to reach said rotation center.

2. The method as claimed in claim 1, wherein said distance prevents a static electricity from causing an electrostatic discharge damage of a dielectric film formed at around said rotation center on said semiconductor wafer.

3. The method as claimed in claim 1, wherein said cleaning solution is provided at two ejection points from two nozzles.

4. The method as claimed in claim 1, wherein said cleaning solution removes a chemical solution remaining at said rotation center, said chemical solution having been used as a part of performing a chemical mechanical polishing for said one surface of said semiconductor wafer.

5. The method as claimed in claim 1, wherein said cleaning solution removes a chemical solution remaining at said rotation center, said chemical solution being provided on said one surface of said semiconductor wafer before said cleaning solution is provided so as to remove a particle from said one surface of said semiconductor wafer.

6. The method as claimed in claim 5, further comprising:

providing another cleaning solution on another surface of said semiconductor wafer at another ejection point which is separate from said rotation center at a substantially same distance as said distance while said providing a chemical solution on said one surface of said semiconductor wafer is performed, to prevent said chemical solution from reaching said another surface of said semiconductor wafer.

7. The method as claimed in claim 1, further comprising: providing said cleaning solution on another surface of said semiconductor wafer at another ejecting point which is separate from said rotation center at a substantially same distance as said distance while said providing a cleaning solution on one surface of said semiconductor wafer is performed.

8. The method as claimed in claim 1, wherein said cleaning solution removes an organic chemical solution remaining at said rotation center, said organic chemical solution being provided to remove a resist layer formed on said one surface of said semiconductor wafer.

9. The method as claimed in claim 1, wherein said distance comprises at least 1 centimeter.

10. The method as claimed in claim 1, wherein said cleaning solution is provided from a nozzle at an angle which is more than 5 degrees and less than 90 degrees to said one surface of said semiconductor wafer.

11. The method as claimed in claim 1, wherein said cleaning solution has a resistivity which is less than 1M ohm centimeter.

12. The method as claimed in claim 1, wherein said cleaning solution comprises a carbon dioxide.

13. The method as claimed in claim 1, wherein said cleaning solution comprises deionized water.

14. The method as claimed in claim 1, wherein said rotating said semiconductor wafer is performed at a rotation speed which is more than 20 rpm and less than 4000 rpm.

15. The method as claimed in claim 1, wherein said providing said cleaning solution is performed at a speed of flow which is more than 0.2 liters per minute and less than 5 liters per minute.

16. The method as claimed in claim 1, further comprising:

rotating said semiconductor wafer to dry said one surface of said semiconductor wafer after said providing said cleaning solution.

17. A method of cleaning a semiconductor wafer which is placed on a rotating apparatus to rotate on a rotation center of said semiconductor wafer, comprising:

rotating said semiconductor wafer;

providing a cleaning solution on one surface of said semiconductor wafer at an ejection point, said ejection point being separate from said rotation center at a distance that prevents a wiring pattern formed on said semiconductor wafer from dissolutioning at around said rotation center of said semiconductor wafer.

18. The method as claimed in claim 17, wherein said cleaning solution removes a chemical solution remaining at said rotation center, said chemical solution having been used as a part of performing a chemical mechanical polishing for said one surface of said semiconductor wafer.

19. The method as claimed in claim 17, wherein said cleaning solution removes at least one of an etching chemical solution and a resist remover remaining at around said rotation center.

20. A method of cleaning a semiconductor wafer comprising:

forming a first oxide layer on said semiconductor wafer;

forming a resist pattern on said first oxide layer;

removing selectively said first oxide layer with a wet etching solution by using said resist pattern as a mask;

performing a first rinse cleaning to remove said wet etching solution;

removing said resist pattern with a first chemical solution;

performing a second rinse cleaning to remove said first chemical solution;

cleaning said semiconductor wafer with a second chemical solution;

performing a third rinse cleaning to remove said second chemical solution; and forming a second oxide layer on said semiconductor wafer, wherein at least one of a group comprising said first rinse cleaning, said second rinse cleaning, and said third rinse cleaning is performed while said semiconductor wafer is revolved on a rotation center, and a cleaning solution is provided on said semiconductor wafer at an ejection point which is separate from said rotation center at such a distance that prevents said cleaning solution from forming more at around said rotation center than at a periphery area of said semiconductor wafer, and that allows said cleaning solution to reach said rotation center.

21. The method as claimed in claim 1, further comprising:

transferring said semiconductor wafer to a drying chamber to dry said one surface of said semiconductor wafer after said providing said cleaning solution.

22. The method as claimed in claim 1, wherein said distance comprises at least 1 centimeter on a front side of said rotation center.

* * * * *